United States Patent
Yamagami et al.

(10) Patent No.: US 10,804,190 B2
(45) Date of Patent: Oct. 13, 2020

(54) MULTI-CHIP MODULE AND METHOD FOR MANUFACTURING SAME

(71) Applicant: ROHM CO., LTD., Kyoto (JP)

(72) Inventors: Mamoru Yamagami, Kyoto (JP); Yasuhiro Fuwa, Kyoto (JP); Hideaki Yanagida, Kyoto (JP); Takafumi Okada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 83 days.

(21) Appl. No.: 15/180,854

(22) Filed: Jun. 13, 2016

(65) Prior Publication Data

US 2017/0034916 A1    Feb. 2, 2017

(30) Foreign Application Priority Data

Jul. 28, 2015  (JP) .................. 2015-148706

(51) Int. Cl.
*H05K 1/18* (2006.01)
*H01L 23/498* (2006.01)
(Continued)

(52) U.S. Cl.
CPC .... *H01L 23/49827* (2013.01); *H01L 21/6835* (2013.01); *H01L 21/6836* (2013.01); *H01L 23/3107* (2013.01); *H01L 23/49811* (2013.01); *H01L 21/561* (2013.01); *H01L 21/568* (2013.01); *H01L 2221/68327* (2013.01); *H01L 2221/68359* (2013.01); *H01L 2224/96* (2013.01); *H05K 1/16* (2013.01); *H05K 1/162* (2013.01); *H05K 1/18* (2013.01); *H05K 1/185* (2013.01); *H05K 1/186* (2013.01); *H05K 2201/10492* (2013.01)

(58) Field of Classification Search
CPC .... H01L 23/12; H01L 2224/18; Y02P 70/613; H05K 1/16; H05K 1/18; H05K 1/162; H05K 1/186
See application file for complete search history.

(56) References Cited

U.S. PATENT DOCUMENTS 6,870,248 B1 * 3/2005 Shibata .................. H01L 21/56
257/678
7,381,593 B2 * 6/2008 Ararao ................ H01L 23/3107
257/E23.037

(Continued)

FOREIGN PATENT DOCUMENTS

JP    2004-247617 A    9/2004
JP    2006196865 A    7/2006

(Continued)

OTHER PUBLICATIONS

Notification of Reasons for Refusal of JP Patent Application 2015-148706 (related application); dated Feb. 21, 2019; 7 pages.

(Continued)

*Primary Examiner* — Paresh H Paghadal
(74) *Attorney, Agent, or Firm* — Gregory M. Howison

(57) ABSTRACT

A multi-chip module includes a plurality of chip parts with each chip part having an electrode, a sealing resin for sealing the plurality of chip parts, and an external connection terminal secured to the sealing resin so as to be exposed from the outer surface of the sealing resin and electrically connected to the electrode of at least one of the chip parts.

16 Claims, 15 Drawing Sheets

(51) Int. Cl.
*H01L 21/683* (2006.01)
*H01L 23/31* (2006.01)
*H01L 21/56* (2006.01)
*H05K 1/16* (2006.01)

(56) References Cited

U.S. PATENT DOCUMENTS

| | | | | |
|---|---|---|---|---|
| 7,999,371 | B1* | 8/2011 | Arcedera | H01L 23/433 257/706 |
| 8,315,060 | B2* | 11/2012 | Morikita | H05K 1/0218 361/748 |
| 2002/0036345 | A1* | 3/2002 | Iseki | H01L 23/16 257/734 |
| 2002/0117743 | A1* | 8/2002 | Nakatani | H01L 21/4857 257/687 |
| 2002/0158319 | A1 | 10/2002 | Shibata | |
| 2004/0262774 | A1* | 12/2004 | Kang | H01L 21/563 257/777 |
| 2006/0131719 | A1* | 6/2006 | Nakayama | H01L 23/3114 257/686 |
| 2008/0055859 | A1 | 3/2008 | Furukawa et al. | |
| 2008/0150096 | A1* | 6/2008 | Ishio | H01L 23/5389 257/659 |
| 2011/0085310 | A1* | 4/2011 | Cachia | H05K 1/182 361/764 |
| 2011/0141681 | A1* | 6/2011 | Nakashiba | G11C 5/005 361/679.31 |
| 2011/0228507 | A1 | 9/2011 | Yin et al. | |
| 2011/0278707 | A1* | 11/2011 | Chi | H01L 24/97 257/676 |
| 2012/0038064 | A1* | 2/2012 | Camacho | H01L 21/4832 257/777 |
| 2012/0181673 | A1* | 7/2012 | Pagaila | H01L 21/568 257/659 |
| 2012/0307466 | A1* | 12/2012 | Fujidai | H01L 24/18 361/763 |
| 2013/0069239 | A1* | 3/2013 | Kim | H01L 23/49827 257/774 |
| 2013/0087898 | A1* | 4/2013 | Chi | H01L 21/4832 257/666 |
| 2014/0138816 | A1* | 5/2014 | Lu | H01L 23/49827 257/737 |

FOREIGN PATENT DOCUMENTS

| | | | |
|---|---|---|---|
| JP | 2008060426 | A | 3/2008 |
| JP | 2008112941 | A | 5/2008 |
| JP | 2009170553 | A | 7/2009 |
| JP | 2011054652 | A | 3/2011 |
| JP | 2011091091 | A | 5/2011 |
| JP | 2013098373 | A | 5/2013 |
| JP | 2013165157 | A | 8/2013 |
| JP | 2015122507 | A | 7/2015 |

OTHER PUBLICATIONS

JP: Office Action of 2015-148706 (related application); dated Jul. 4, 2019; 8 pages.

JP: Decision to Grant a Patent of JP 2015-148706 (related application); dated Nov. 7, 2019; 5 pages.

* cited by examiner

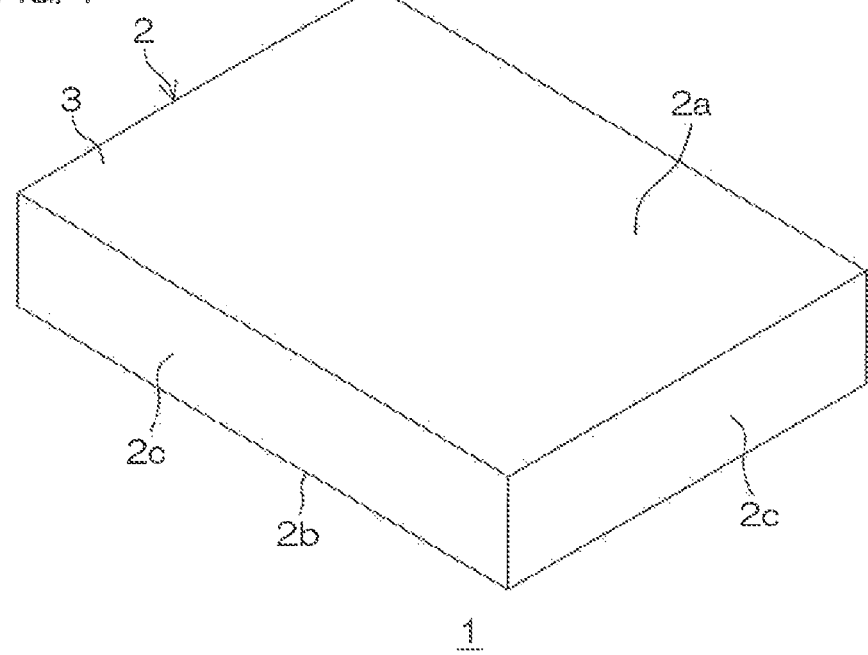
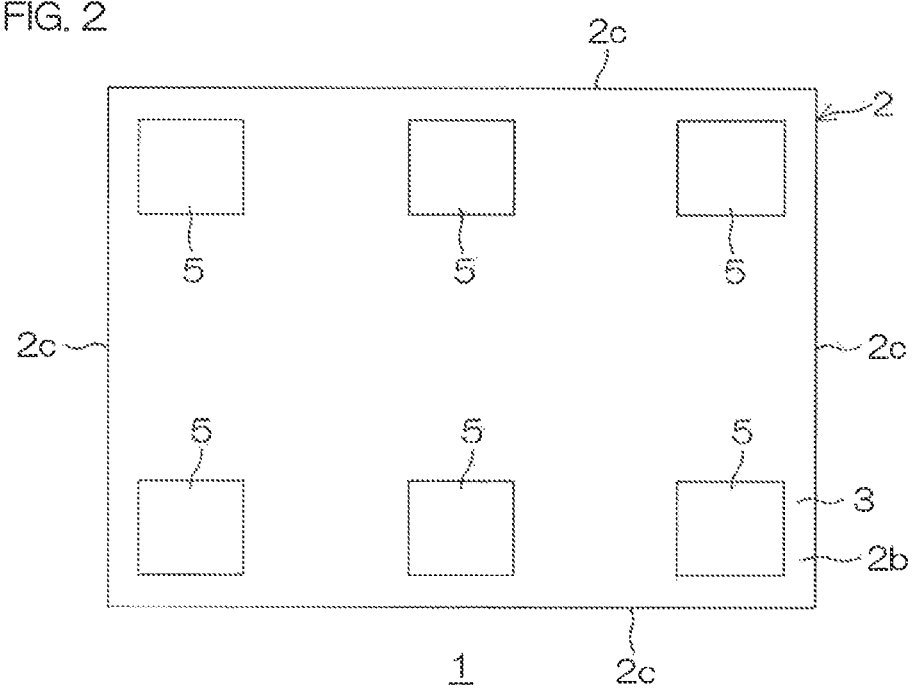

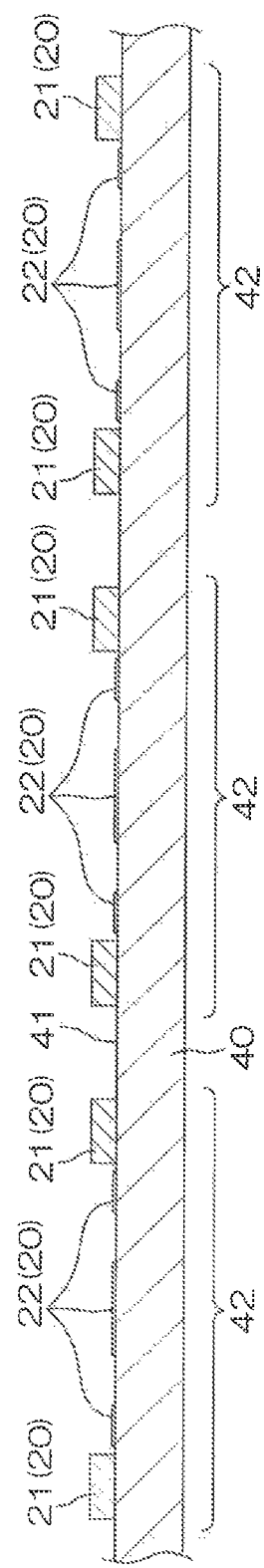

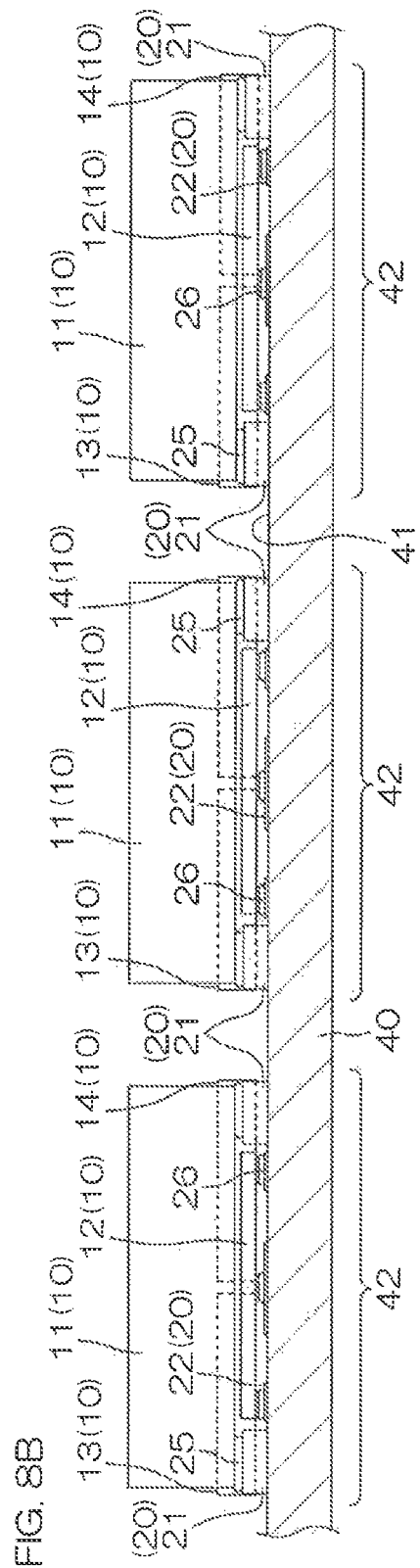

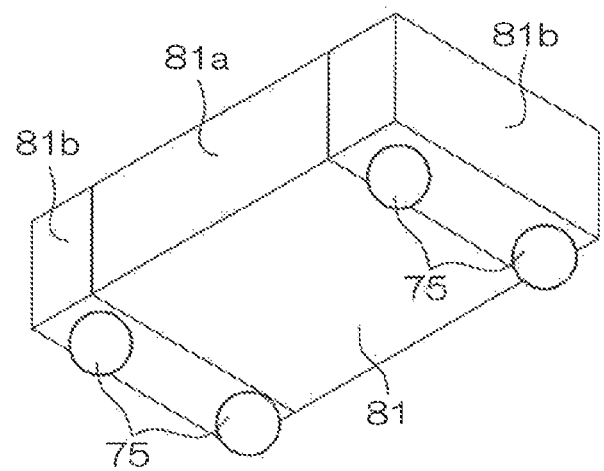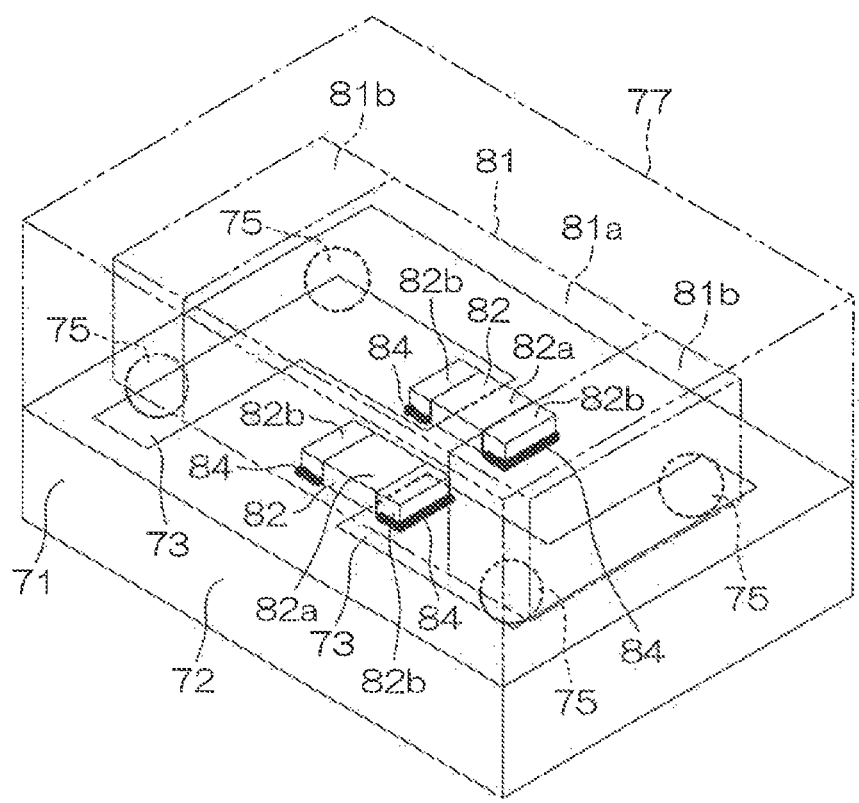
FIG. 10

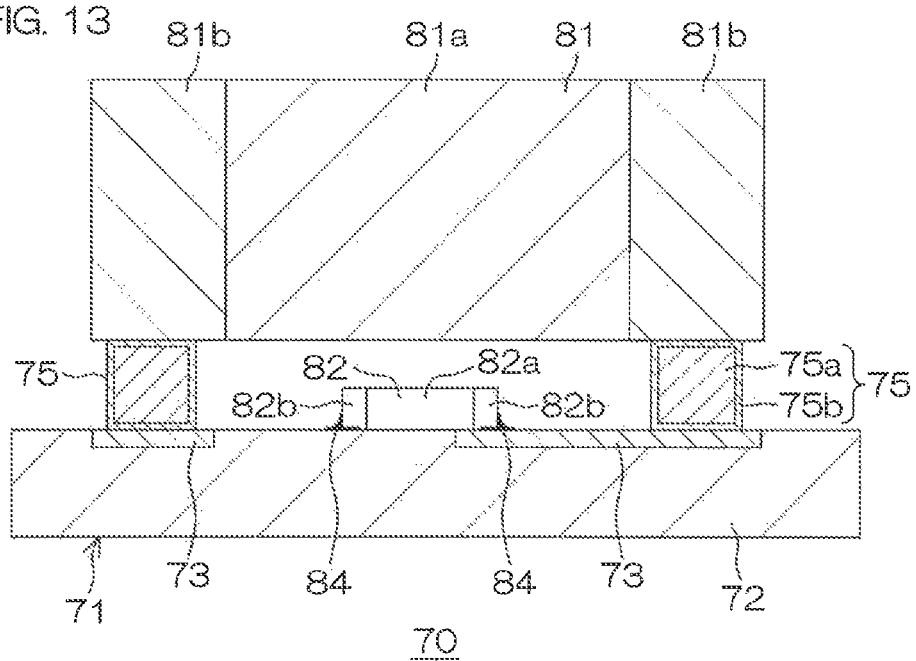

MULTI-CHIP MODULE AND METHOD FOR MANUFACTURING SAME

BACKGROUND OF THE INVENTION

1. Field of the Invention

The present invention relates to a multi-chip module including a plurality of chip parts and a method for manufacturing a multi-chip module.

2. Description of the Related Art

An example of a multi-chip module that seals a plurality of chips in a resin is disclosed in US2002/0158319A1. The multi-chip module includes an interposer having an external connection terminal, a plurality of semiconductor chips mounted on the interposer, and a mold resin for sealing the plurality of semiconductor chips.

SUMMARY OF THE INVENTION

An embodiment according to the present invention provides a multi-chip module including a plurality of chip parts with each chip part including an electrode, a sealing resin for sealing the plurality of chip parts, and an external connection terminal secured to the sealing resin to be exposed from the outer surface of the sealing resin, and electrically connected to the electrode of at least one of the chip parts.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a perspective view of a multi-chip module according to a first embodiment of the present invention.

FIG. 2 is a bottom view of the multi-chip module.

FIGS. 8A-8F are cross-sectional views illustrating major steps of the manufacturing steps.

FIG. 10 is a perspective view illustrating an example of the structure of a multi-chip module having a plurality of chip parts mounted on a wiring substrate.

FIG. 13 is a cross-sectional view illustrating a variation of the structure shown in FIGS. 10-12.

DETAILED DESCRIPTION OF THE PREFERRED EMBODIMENTS

Figure 3:
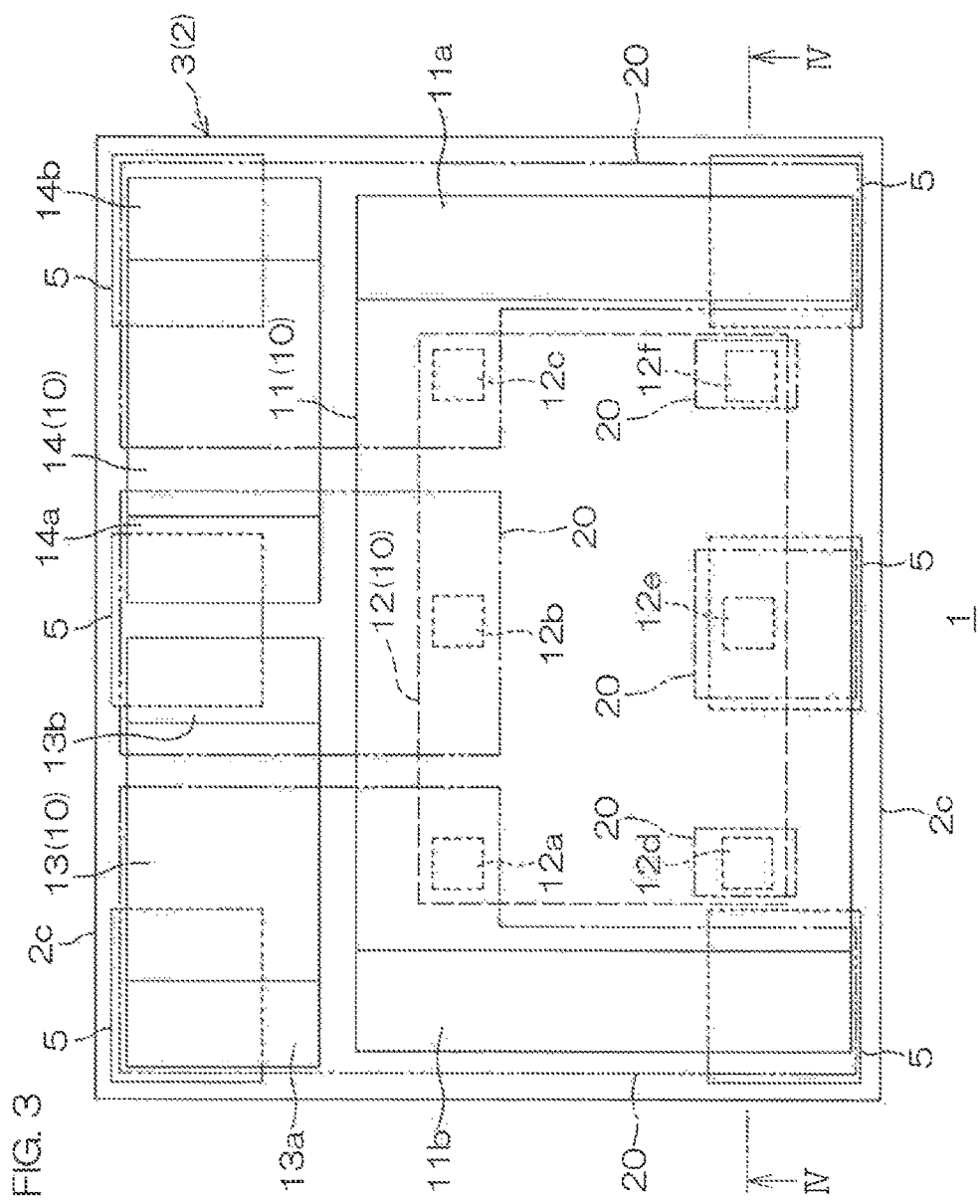
FIG. 3 is a perspective plan view illustrating the internal configuration of the multi-chip module.

The multi-chip module disclosed in US2002/0158319A1 has a structure that supports a plurality of chips using an interposer, and therefore the miniaturization of the multi-chip module is limited by the machining accuracy of the interposer. Similarly, in the case where a multi-chip module is manufactured with a plurality of chips mounted on a metal substrate such as a lead frame, the limit of miniaturization of the multi-chip module is determined by the limit of the fine machining of the lead frame.

An embodiment according to the present invention provides a multi-chip module that has a structure advantageous for the miniaturization thereof, and a method for manufacturing such a multi-chip module.

An embodiment according to the present invention provides a multi-chip module including a plurality of chip parts with each chip part including an electrode, a sealing resin for sealing the plurality of chip parts, and an external connection terminal secured to the sealing resin so as to be exposed from the outer surface of the sealing resin, and electrically connected to the electrode of at least one of the chip parts.

In such a configuration, a multi-chip module is constituted by sealing a plurality of chip parts together in a sealing resin. That is, a single electronic component providing advanced functions (composite functions) is constituted by a plurality of chip parts. The electrode of at least one of the chip parts is connected to the external connection terminal. The multi-chip module is connected to external electrical and electronic circuits via the external connection terminal. The external connection terminal is secured to the sealing resin so as to be exposed from the outer surface of the sealing resin. That is, the external connection terminal is disposed on the surface of the sealing resin for sealing the chip parts. As such, the multi-chip module is configured so that the multi-chip module can be connected to external circuits without using a supporting substrate such as an interposer or a lead frame. Therefore, the miniaturization of the multi-chip module is not limited by the machining accuracy of a supporting substrate, and thus the multi-chip module can be miniaturized beyond the limit of the machining accuracy of such supporting substrate.

According to an embodiment of the present invention, a supporting substrate is not interposed between the external connection terminal and the sealing resin, and the plurality of chip parts is supported by the sealing resin.

With such a configuration, a supporting substrate such as an interposer or a lead frame is not interposed between the external connection terminal and the sealing resin, and thus the miniaturization of the multi-chip module is not limited by the limit of the machining accuracy of such supporting substrate.

According to an embodiment of the present invention, internal wiring for electrically connecting at least two of the plurality of chip parts is sealed in the sealing resin.

With such a configuration, a plurality of chip parts is electrically connected to each other via the internal wiring sealed in the sealing resin. Thereby, an electronic circuit achieving advanced functions is formed in the multi-chip module via the internal wiring in the sealing resin. As such, a multi-chip module capable of providing advanced functions with a small number of the external connection terminals can be achieved. Thereby, further miniaturization can be achieved.

According to an embodiment of the present invention, the sealing resin includes a first resin part that seals the plurality of chip parts therein with the internal wiring formed to be exposed from one surface of the first resin part, and a second resin part that covers the one surface of the first resin part so as to cover the internal wiring, and the external connection terminal is formed so as to be exposed from the second resin part.

With such a configuration, the internal wiring is formed to be exposed from one surface of the first resin part, and then the internal wiring is covered with the second resin part, so that the internal wiring is sealed in the sealing resin. Thereby, a multi-chip module with a structure that seals internal wiring in a sealing resin can be provided by executing relatively simple manufacturing steps.

According to an embodiment of the present invention, the plurality of chip parts may include at least two chip parts arranged not to overlap each other in the plan view. The "in the plan view" indicates the viewing of the chip parts along a normal direction to the surface (for example, the pattern formation surface of a wiring substrate) on which the multi-chip module is to be mounted.

With this configuration, at least two chip parts are arranged side by side (so-called side-by-side arrangement) so as not to mutually overlap in the plan view. Such a configuration facilitates creating a lower profile multi-chip module.

According to an embodiment of the present invention, the plurality of chip parts includes at least two chip parts arranged to mutually overlap in the plan view.

With this configuration, at least the two chip parts mutually overlap in the plan view, and thus these two chip parts are three-dimensionally arranged. Thereby, the size of the multi-chip module in the plan view decreases, to thus decrease the occupancy area thereof when mounted.

The overlap among chip parts may be a partial overlap or an overall overlap. The overall overlap indicates that the whole portion of one chip part overlaps the other chip part.

According to an embodiment of the present invention, the multi-chip module further includes a spacer composed of an electrically conductive material arranged between the electrode of a first chip part among the plurality of chip parts and one surface of the sealing resin, and at least a portion of a second chip part among the plurality of chip parts is arranged between the first chip part and the one surface of the sealing resin.

With this configuration, the first chip part is elevated by the spacer, so that the arrangement space for the second chip part can be secured between the first chip part and the surface of the sealing resin. As such, a plurality of chip parts can be stereoscopically or three-dimensionally arranged.

Since the spacer is made up of an electrically conductive material, the spacer can be used as an electrically conducting path between the electrode of the first chip part, and the external connection terminal or the internal wiring. Thus, both the first chip part and the second chip part can be connected to the internal wiring or the external connection terminal.

According to an embodiment of the present invention, the plurality of chip parts may include a plurality of types of chip parts with each type of chip part having a different function. Thus, a multi-chip module capable of achieving advanced functions can be provided by combining a plurality of types of chip parts. Of course, the plurality of chip parts may include the same type of chip parts having the same function.

According to an embodiment of the present invention, the plurality of chip parts may include at least one type of chip part among a chip inductor, a chip capacitor, a memory chip, a chip resistor, an integrated circuit chip, and a microelectromechanical system (MEMS) chip.

According to an embodiment of the present invention, the plurality of chip parts may include a power supply driver chip, a chip inductor, and a chip resistor. Thereby, a multi-chip module having a power supply function can be provided.

According to an embodiment of the present invention, the power supply driver chip is arranged under the chip inductor, and the power supply driver chip is completely overlapped by the chip inductor in the plan view. Thereby, a multi-chip module with the size decreased in the plan view can be provided.

According to an embodiment of the present invention, the plurality of chip parts may include a controller chip, a power transistor chip controlled by the controller chip, a chip inductor, and a chip resistor. Thereby, a power supply circuit can be provided by a multi-chip module including the controller chip and the power transistor chip respectively constituted by separate chips.

According to an embodiment of the present invention, the chip resistor is arranged not to overlap the chip inductor in the plan view. Such a configuration is preferably applied specifically to the case where the height of the chip resistor is greater than the height of the power supply driver chip. Thereby, the chip inductor can be arranged at the lowest position possible, to thus facilitate creating a lower profile multi-chip module.

In particular, when the size of the power supply driver chip is greater than that of the chip resistor in the plan view, the size of the multi-chip module in the plan view can be decreased while at the same time lowering the height of the multi-chip module.

An embodiment of the present invention provides a method for manufacturing a multi-chip module including a step of forming an internal wiring on a wiring transfer substrate, a step of arranging a plurality of chip parts on the wiring transfer substrate and bonding the electrodes of the chip parts onto the internal wiring, a step of sealing the plurality of chip parts arranged on the wiring transfer substrate and the internal wiring in a resin, a step of removing the wiring transfer substrate from the resin thereby transferring the internal wiring to the resin, and a step of securing an external connection terminal electrically connected to at least one of the chip parts via the internal wiring to the resin so as to be exposed from the resin.

According to the method described above, a plurality of chip parts can be arranged in a small region by forming a fine internal wiring on a wiring transfer substrate. The plurality of chip parts is sealed on the wiring transfer substrate and then the wiring transfer substrate is removed, and thus it is possible to produce a multi-chip module with a structure that allows a sealing resin to support the plurality of chip parts without using a supporting substrate. External connection can be achieved by the external connection terminal secured to the resin so as to be exposed from the resin. The multi-chip module has a structure that does not use a supporting substrate, and therefore can be advantageously miniaturized without being limited by the machining accuracy of the supporting substrate.

According to an embodiment of the present invention, the manufacturing method further includes a step for forming a resin film for covering the internal wiring on the surface of the resin after the step of transferring the internal wiring, and a step of forming a pad opening in the resin film for exposing a portion of the internal wiring. The step of securing the external connection terminal includes a step of forming the external connection terminal on the resin film so as to be bonded to the internal wiring via the pad opening. This method makes it possible to produce a multi-chip module configured to seal the internal wiring in the resin.

According to an embodiment of the present invention, a plurality of regions with each region corresponding to each of a plurality of multi-chip modules is provided on the wiring transfer substrate, each step described above is executed at the same time for the plurality of regions, the step of sealing the chip part and the internal wiring is a step of collectively sealing the chip parts and the internal wiring with the resin that extends continuously over the plurality of regions, and the manufacturing method further includes a dicing step of cutting and dividing the resin into the plurality of regions. This method makes it possible to collectively produce a plurality of multi-chip modules, and thus is advantageous for mass production.

For example, the formation of internal wiring onto the wiring transfer substrate can be achieved by using a manufacturing process of a semiconductor device. That is, internal wiring can be formed in the process of manufacturing a semiconductor device by making use of a wiring transfer substrate with a size and a shape capable of being handled by semiconductor manufacturing equipment. By using this method, it is possible to forma fine internal wiring. A plurality of multi-chip modules can be obtained by placing a plurality of chip parts on the fine internal wiring, collectively sealing the plurality of chip parts and the internal wiring with a resin, thereafter by cutting the resin. By adopting such a method, a plurality of regions for the multi-chip modules can be created on the wiring transfer substrate with a higher density than the case where a supporting substrate such as an interposer or a lead frame is employed. As such, a large number of multi-chip modules can be manufactured at one time, and thus higher productivity can be achieved.

According to an embodiment of the present invention, the step of forming the internal wiring includes a step of forming an internal wiring including a thick film portion and a thin film portion thinner than the thick film portion, and a first chip part in the plurality of chip parts is placed on the thick film portion while a second chip part in the plurality of chip parts is placed on the thin film portion. This method makes it possible to arrange the first and second chip parts stereoscopically or three-dimensionally with mutually different heights. Such a three-dimensional arrangement facilitates the miniaturization of multi-chip modules.

According to an embodiment of the present invention, the first chip part and the second chip part are arranged to overlap each other in the plan view. In this method, since the first and second chip parts overlap each other in the plan view, it is possible to reduce the occupation area of the multi-chip module in the plan view. The thick film portion functions as a spacer for elevating the first chip part that is to be arranged thereon, thereby allowing the whole or part of the second chip part to be arranged in the space secured by the space.

According to an embodiment of the present invention, the second chip part may be arranged to be completely overlapped by the first chip part in the plan view. This method makes it possible to further reduce the occupation area of the multi-chip module in the plan view.

According to an embodiment of the present invention, a third chip part among the plurality of the chip parts may be arranged not to overlap either the first chip part or the second chip part in the plan view. In this method, the third chip part and the first or the second chip part are arranged side by side, thereby facilitating creating a lower profile multi-chip module.

Hereinafter, embodiments according to the present invention will be specifically discussed with reference to the attached drawings.

FIG. 1 is a perspective view of a multi-chip module according to a first embodiment of the present invention, and FIG. 2 is a bottom view thereof.

The multi-chip module 1 includes a package body 2. The package body 2 has a flat rectangular parallelepiped shape in this embodiment, and has one upper surface 2a, one bottom surface 2b, and four side surfaces 2c. The four side surfaces 2c are each continued to four pairs of sides facing each other of the upper surface 2a and the bottom surface 2b to thus connect the upper surface 2a and the bottom surface 2b. The package body 2 contains a sealing resin 3. The sealing resin 3 includes, for example, an epoxy resin.

A plurality of external connection terminals 5 (six terminals in this embodiment) are formed on the bottom surface 2b of the package body 2 so as to be exposed from the package body 2. The plurality of external connection terminals 5 are each formed in a substantially rectangular shape, and arranged apart from each other. The plurality of external connection terminals 5 are arrayed along the periphery of the bottom surface 2b in this embodiment. More specifically, each three external connection terminals 5 are arrayed apart from each other along a pair of long sides in the longitudinal direction of the rectangular bottom surface 2b. Each of the external connection terminals 5 is arranged inward from the side surfaces 2c of the package body 2 with a distance therebetween. Each of the external connection terminals 5 is connected to wiring provided on a mounting substrate (not shown), for example, by soldering.

Figure 4:
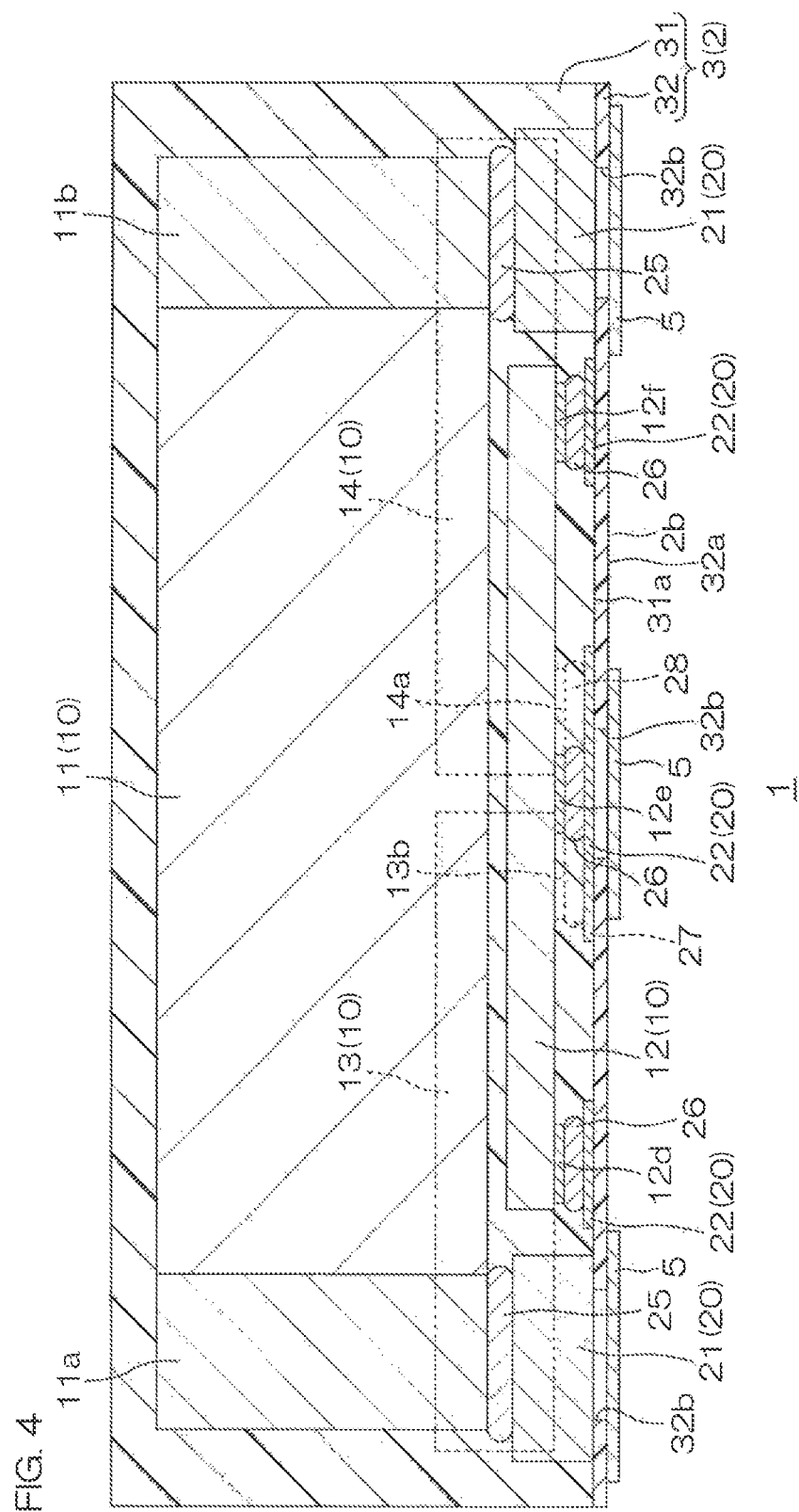
FIG. 4 is a cross-sectional view taken along line IV-IV of FIG. 3.

FIG. 3 is a perspective plan view illustrating the internal configuration of the multi-chip module 1, and FIG. 4 is a cross-sectional view taken along line IV-IV of FIG. 3. The multi-chip module 1 includes a plurality of chip parts 10 sealed together in the sealing resin 3. The plurality of chip parts 10 includes one chip inductor 11, one integrated circuit chip 12, and two chip resistors 13, 14.

The chip inductor 11 is formed in a substantially rectangular shape in the plan view, and provided with a pair of electrodes 11a, 11b at both ends in the longitudinal direction. The electrodes 11a, 11b are composed of, for example, aluminum. The chip inductor 11 is the largest chip in the plurality of chip parts 10 sealed in the sealing resin 3 in this embodiment, and both the area in the plan view and the thickness in the cross-sectional view (see FIG. 4) are greater than those of any other chip parts. The chip inductor 11 is arranged near the side surface 2c constituting one of the long sides of the package body 2 in the plan view with the longitudinal direction of the chip inductor 11 adjusted to the side surface 2c.

An integrated circuit chip 12 is formed in a substantially rectangular shape in the plan view, having totally six electrodes 12a, 12b, 12c, 12d, 12e and 12f on the bottom surface with each three electrodes arranged along a pair of the long sides. The electrodes 12a-12f are composed of, for example, aluminum. In this embodiment, the integrated circuit chip 12 is completely overlapped by the chip inductor 11 in the plan view, and is arranged in the space between the chip inductor 11 and the bottom surface 2b of the package body 2.

Chip resistors 13, 14 are formed in a substantially rectangular shape in the plan view, and are each provided with pairs of electrodes 13a, 13b; 14a, 14b at both ends in the longitudinal direction. The electrodes 13a, 13b; 14a, 14b are composed of, for example, aluminum. The chip resistors 13, 14 are arranged near one of the side surfaces 2c constituting the long side of the package body 2 in the plan view with the longitudinal direction adjusted parallel to the side surface 2c. The two chip resistors 13, 14 are arrayed along the longitudinal direction of the side surface 2c in the plan view. The chip resistors 13, 14 and the chip inductor 11 do not overlap each other in the plan view. The size of the chip resistors 13, 14 in the plan view is smaller than that of the integrated circuit chip 12. As shown in FIG. 4, the chip resistors 13, 14 are thicker than the integrated circuit chip 12, and the upper surface of these chip resistors 13, 14 is located above the bottom surface of the chip inductor 11.

Internal wiring 20 is sealed by the sealing resin 3 at the position near the bottom surface 2b of the package body 2. The internal wiring 20 is composed of, for example, copper or nickel. The internal wiring 20 has thick film portions 21 at regions corresponding to the lower side of the electrodes 11a, 11b of the chip inductor 11, and has thin film portions 22 thinner than the thick film portions 21 in the other regions of the internal wiring 20. The thick film portions 21 are spacers for elevating the chip inductor 11 to secure a space below the chip inductor 11 for allowing the integrated circuit chip 12 to be arranged therein. The electrodes 11a, 11b of the chip inductor 11 are bonded to the thick film portions 21 with solder 25. The electrodes 12a-12f of the integrated circuit chip 12 and the electrodes 13a, 13b; 14a, 14b of the chip resistors 13, 14 are bonded to the thin film portions 22 with solders 26, 27, and 28.

The sealing resin 3 includes a first resin part 31 and a second resin part 32. The plurality of chip parts 10 are sealed together in the first resin part 31. The inner wiring 20 is exposed from a bottom surface 31a of the first resin part 31. The film-like second resin part 32 is formed to cover the bottom surface 31a of the first resin part 31 and the inner wiring 20. Thereby, the sealing resin 3 seals the internal wiring 20 together with the chip parts 10.

The external connection terminals 5 are formed on the bottom surface 32a of the second resin part 32, so that the external connection terminals 5 are secured to the sealing resin 3 while being exposed from the sealing resin 3. Pad openings 32b for connecting the internal wiring 20 to the external connection terminals 5 are formed in the second resin part 32. The external connection terminals 5 are thrust through the pad openings 32b to be bonded to the internal wiring 20.

Figure 5:
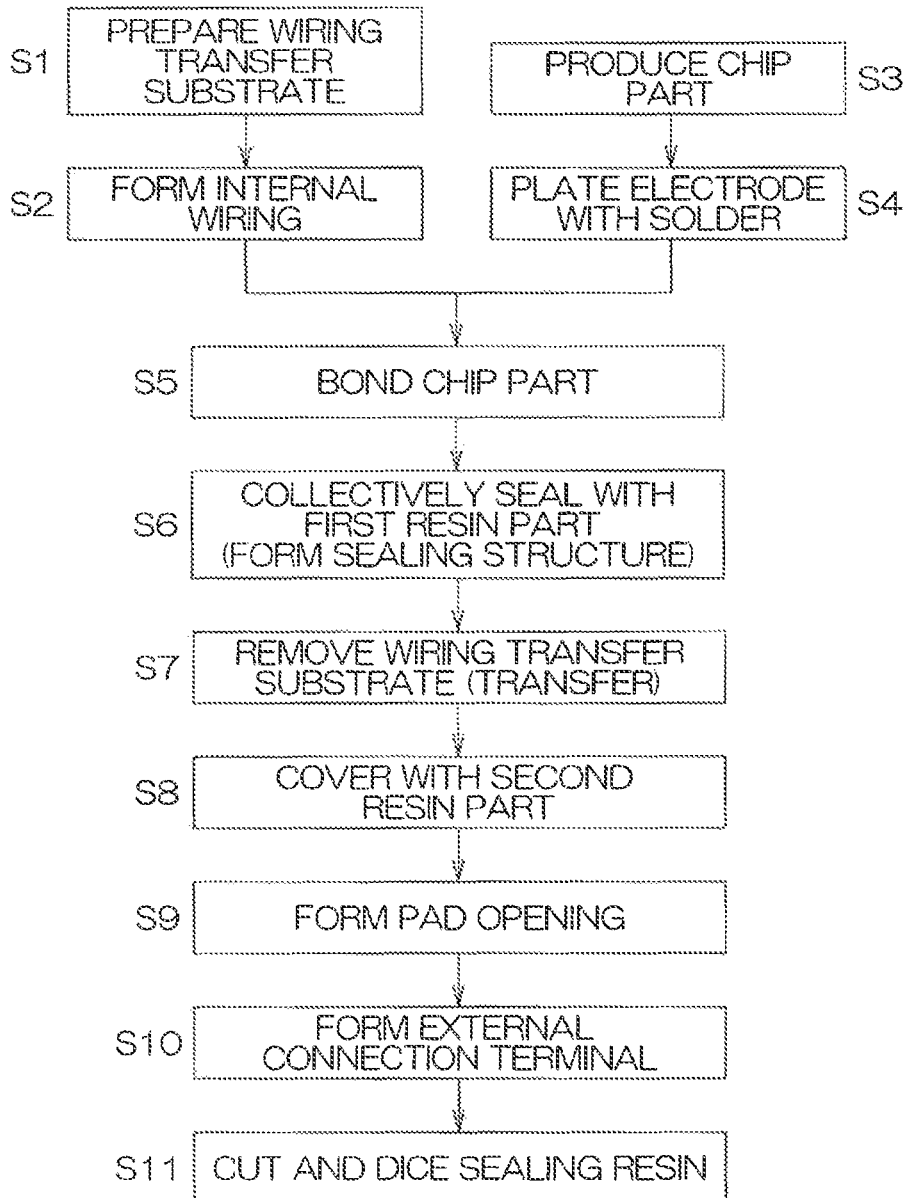
FIG. 5 is a flowchart illustrating an example of manufacturing steps for the multi-chip module.
Figure 6:
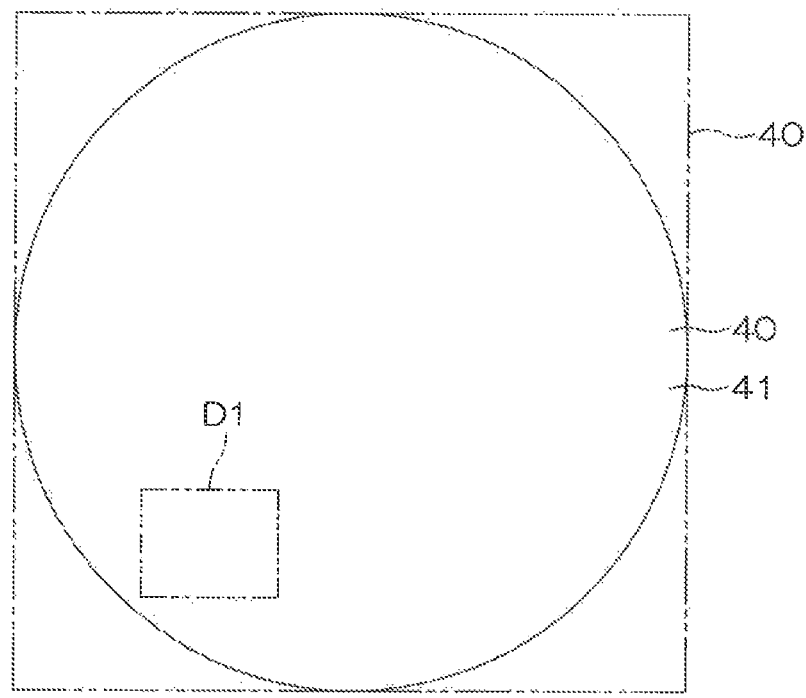
FIG. 6 is a plan view of a wiring transfer substrate used in the manufacturing steps for the multi-chip module.

FIG. 5 is a flowchart illustrating an example of manufacturing steps for the multi-chip module 1. FIG. 6 is a plan view of a wiring transfer substrate used in the manufacturing steps for the multi-chip module 1, and FIG. 7 is an enlarged plan view of a region D1 shown in FIG. 6.

A wiring transfer substrate 40 is prepared when manufacturing the multi-chip module 1 (Step S1). The wiring transfer substrate 40 is a disc formed in a substantially circular shape in this embodiment (see a solid line in FIG. 6). The wiring transfer substrate 40 may be a substantially rectangular flat plate in the plan view in place of the substantially circular disc in the plan view (see a chain double-dashed line in FIG. 6).

The wiring transfer substrate 40 is preferably composed of a plate material that can be removed from the sealing resin 3 (specifically from the first resin part 31) and the internal wiring 20 by peeling and/or etching. The plate material peelable from the sealing resin 3 and the internal wiring 20 is preferably composed of a metal plate containing stainless steel or copper. Also, a plate material (metal plate or semiconductor plate) coated with a polymer that facilitates peeling from the sealing resin 3 and the internal wiring 20 may be used as the wiring transfer substrate 40. Whereas, a plate material removable from the sealing resin 3 by etching may be a semiconductor plate. The semiconductor plate may be a silicon wafer.

Figure 7:
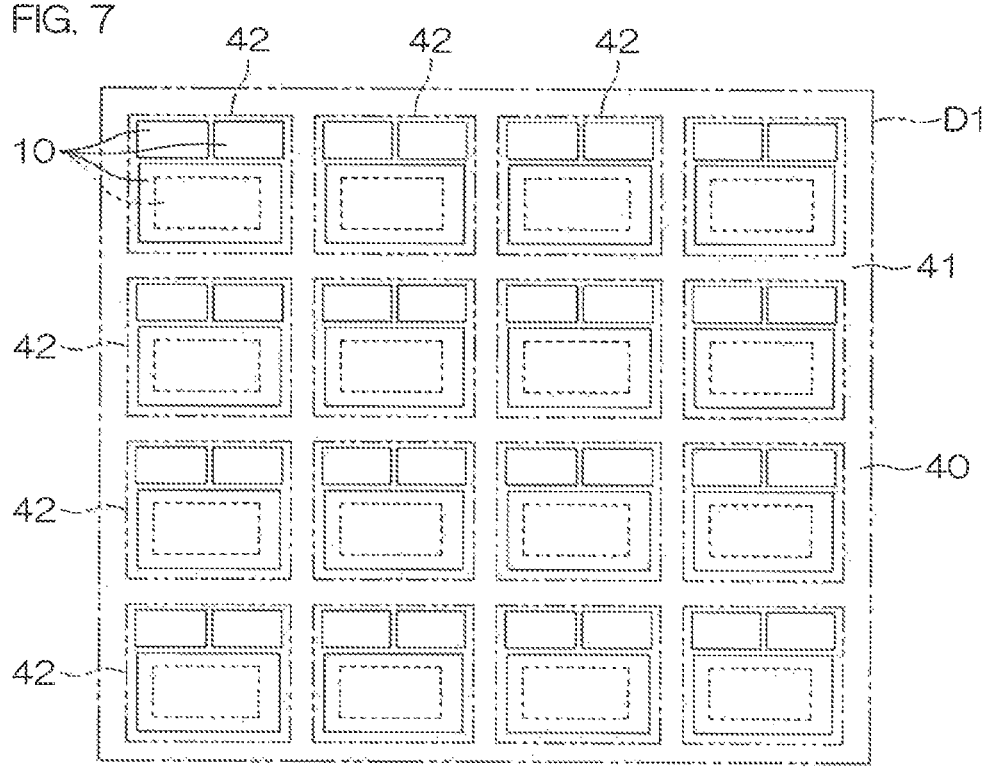
FIG. 7 is an enlarged plan view of a region D1 shown in FIG. 6.

As shown in FIG. 7, a plurality of arrangement regions 42 corresponding to a plurality of multi-chip modules 1 are provided on a pattern formation surface 41 that is one surface of the wiring transfer substrate 40. The plurality of arrangement regions 42, in this embodiment, are arranged in a matrix with each arrangement region apart from each other along a row direction and a columnar direction orthogonal to the row direction. To make the understanding of overall structure easier, FIG. 7 shows a state where a plurality of chip parts 10 are arranged in each of the arrangement regions 42 (see FIG. 8B).

FIGS. 8A-8F are cross-sectional views illustrating major steps of the manufacturing steps.

As shown in FIG. 8A, after the wiring transfer substrate 40 is prepared, the internal wiring 20 is formed on the pattern formation surface 41 of the wiring transfer substrate 40 (Step S2). In this embodiment, the internal wiring 20 for the multi-chip module 1 is formed in each arrangement region 42. The internal wiring 20 may be composed of a single film of a copper film, a gold film, or a nickel film, or may be composed of a laminate film consisting of any two or more types of these films.

As previously described, the internal wiring 20 includes the thick film portions 21 and the thin film portions 22. For example, the thick film portions 21 may be formed by forming a thin conductive film on regions corresponding to both the thick film portions 21 and the thin film portions 22, and then by laminating a conductive material on the thin conductive film with a mask applied to the regions corresponding to the thin film portions 22.

Whereas, the chip parts 10 are each manufactured through other manufacturing steps (Step S3). In the manufacturing steps of the chip parts 10, solder is plated onto the electrodes of each chip part 10 (Step S4).

Next, as shown in FIG. 8B, the chip parts 10 are bonded onto the internal wiring 20 on the wiring transfer substrate 40 with the solder 25-28 (Step S5). More specifically, also with reference to FIG. 3, the electrodes 12a-12f of the integrated circuit chip 12 are set to face the pattern formation surface 41 of the wiring transfer substrate 40, and these electrodes 12a-12f are bonded onto the thin film portion 22 of the internal wiring 20 with the solder 26. Similarly, the electrodes 13a, 13b of the chip resistor 13, and the electrodes 14a, 14b of the chip resister 14 are set to face the pattern formation surface 41 of the wiring transfer substrate 40, and these electrodes 13a, 13b, 14a, 14b are bonded onto the thin film portions 22 of the internal wiring 20 with the solder 27, 28 (see FIG. 4). Further, the electrodes 11a, 11b of the chip inductor 11 are set to face the pattern formation surface 41 of the wiring transfer substrate 40, and these electrodes 11a, 11b are bonded onto the thick film portions 21 of the internal wiring 20 with the solder 25. In this way, the chip parts 10 are flip-chip bonded onto the wiring transfer substrate 40. The chip inductor 11 needs to be bonded after the integrated circuit 12 is bonded, but apart from that, there is no restrictions on the order of the bonding of the chip parts 10. The bonding of the chip parts 10 onto the wiring transfer substrate 40 is carried out specifically by using an automatic mounting machine.

A space corresponding to the height of the internal wiring 20 and the solder 25-28 is formed between the bottom surface of the chip parts 10 and the pattern formation surface 41. The height of the bottom surface of the chip inductor 11 elevated and arranged on the thick film portions 21 is greater than the height of the bottom surface of the integrated circuit chip 12 and the chip resistors 13, 14 arranged on the thin film portions 22. Thereby, a space for storing the integrated chip 12 is secured below the chip inductor 11.

Figure 8C:
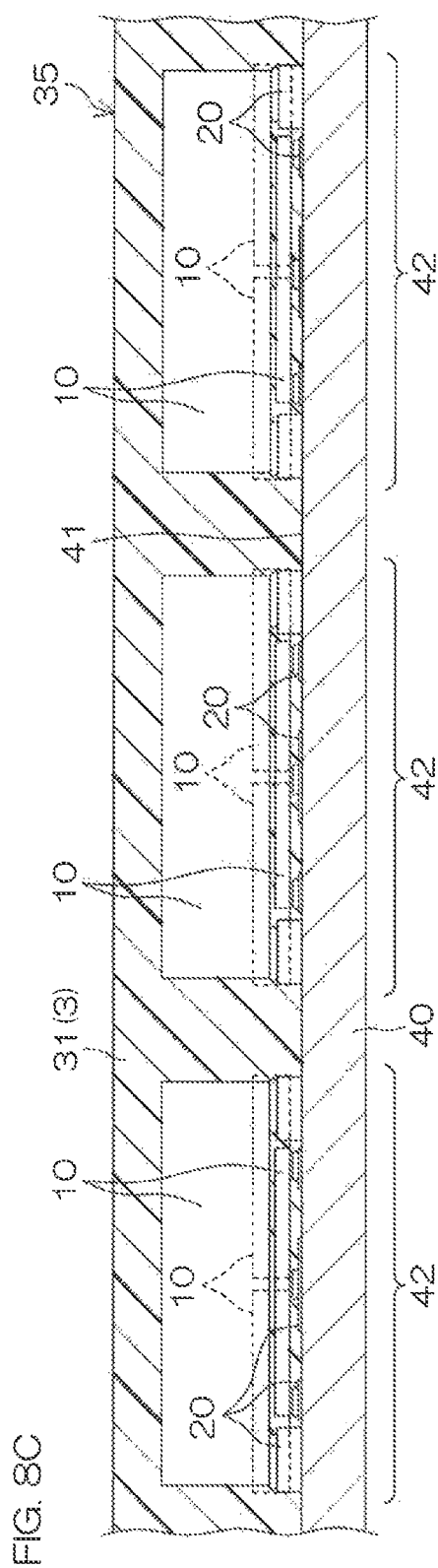

Next, as shown in FIG. 8c, the plurality of chip parts 10 arranged in the plurality of arrangement regions 42 are collectively sealed in the first resin part 31 (sealing resin 3) with the chip parts 10 secured to the wire transfer substrate 40, for example, by coating or molding with an epoxy resin (Step S6). The first resin part 31 extends over the plurality of arrangement regions 42, so that the first resin part 31 collectively seals all the chip parts 10 arranged on the wire transfer substrate 40 and the internal wiring 20. The first resin part 31 fills the gaps formed between the wire transfer substrate 40 and each chip part 10, and covers the side surface and the bottom surface of each chip part 10. The gaps formed between the wire transfer substrate 40 and each chip part 10 may be filled with the first resin part 31 by performing an underfill process. Thereafter, the first resin part 31 is cured by heat applied thereto. Thus, the internal wiring 20 is covered with the first resin part 31 together with the chip parts 10, so that a sealing structure 35 is formed which collectively seals the chip parts 10 in the plurality of arrangement regions 42 with the first resin part 31.

Figure 8D:
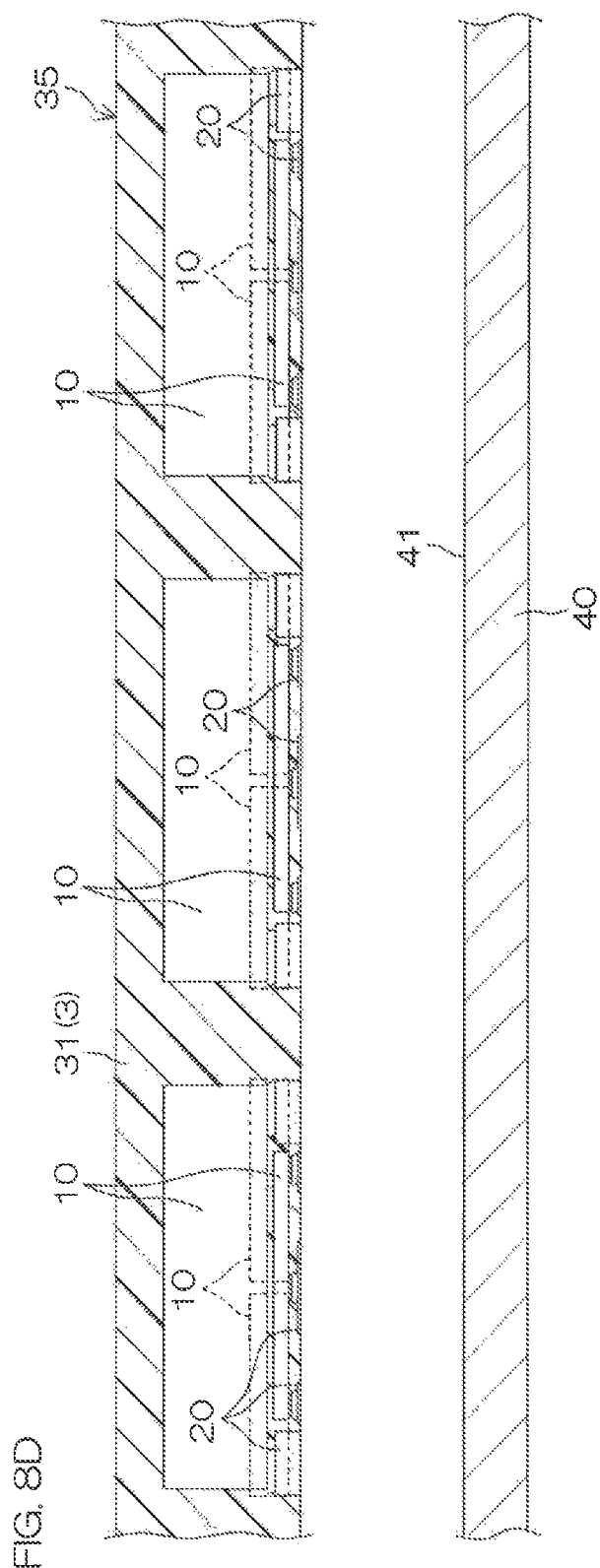

Next, as shown in FIG. 8D, the wiring transfer substrate 40 is removed (peeled off in this example) from the sealing structure 35 (Step S7). By removing the wiring transfer substrate 40 from the sealing structure 35, the internal wiring 20 formed on the wiring transfer substrate 40 is transferred from the wiring transfer substrate 40 to the sealing structure 35 (first resin part 31). The internal wiring 20 transferred to the sealing structure 35, which has the surface that was connected to the wiring transfer substrate 40, is exposed from the bottom surface of the sealing structure 35.

Figure 8E:
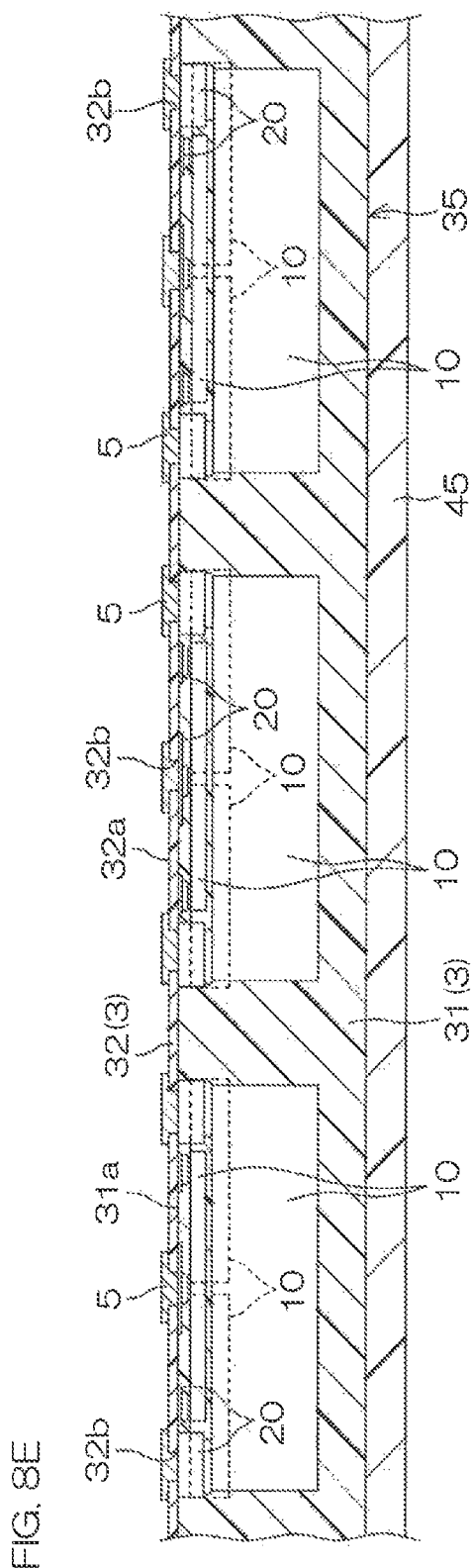

Next, as shown in FIG. 8E, the sealing structure 35 is supported on a flexible tape 45 so as to expose the bottom surface 31a of the first resin part 31. Then, a resin film constituting the second resin part 32 is formed on the bottom surface of the sealing structure 35 (Step S8). The second resin part 32 covers the bottom surface 31a of the first resin part 31, and covers the surface of the internal wiring 20 exposed from the first resin part 31. The second resin part 32 may be composed of, for example, a polyimide film. In this case, for example, a resin film composed of a photosensitive polyimide is applied to the bottom surface to the sealing structure 35. The second resin part 32 (resin film) is exposed in a pattern corresponding to the pad opening 32b, and developed. Thereby, the pad openings 32b are formed in the second resin part 32 (Step S9). After that, heat treatment for curing the second resin part 32 (resin film) is carried out.

After that, a nickel film and a gold film are sequentially formed in the region including the pad openings 32b, for example, using electroless plating or electroplating process, and thus the external connection terminals 5 are formed on the surface of the second resin part 32 (Step S10). The external connection terminals 5 are bonded onto the internal wiring 20 through the pad openings 32b, and are adhered to and secured to the surface of the second resin part 32.

Figure 8F:
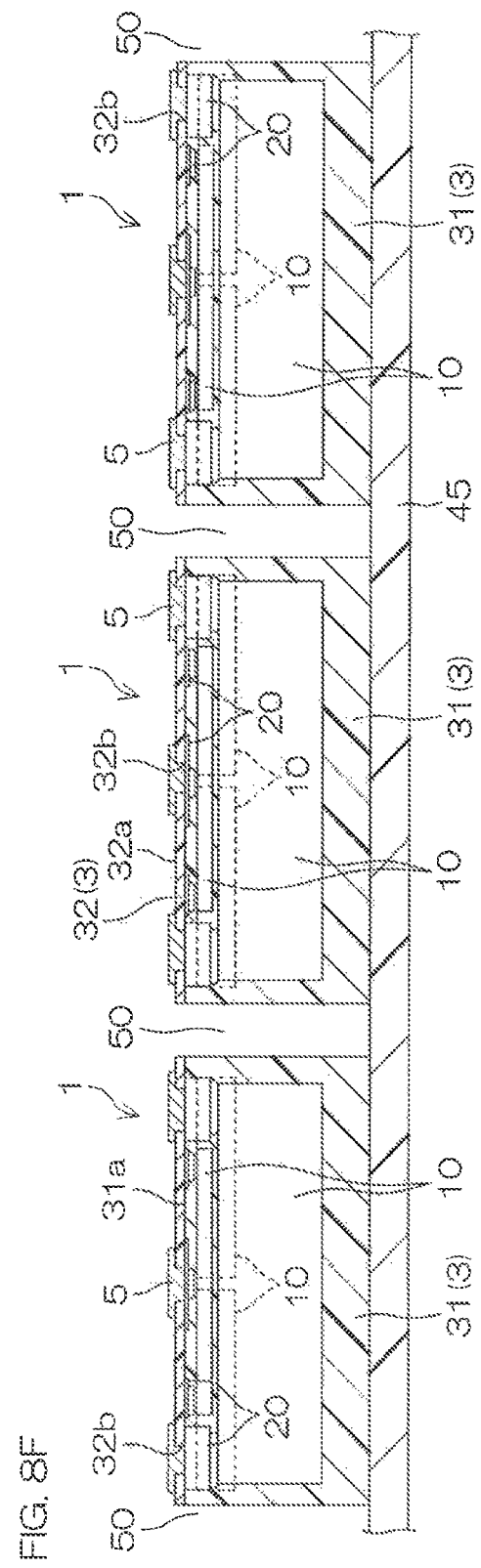

Next, as shown in FIG. 8F, the sealing resin 3 is cut off along a cutting region 50 provided lineally (in a grid pattern) between the plurality of regions corresponding to the plurality of multi-chip modules 1 (regions corresponding to arrangement regions 42) (Step S11). Thereby, the sealing structure 35 is diced into the plurality of multi-chip modules 1 with each including the plurality of chip parts 10. In this embodiment, each diced sealing structure includes a plurality of chip parts. As such, the multi-chip module 1, in which the plurality of chip parts 10 is sealed together in the sealing resin 3, is manufactured.

As described above, according to this embodiment, the multi-chip module 1, in which the plurality of chip parts 10 are sealed together in the sealing resin 3, is provided. The plurality of chip parts 10 are electrically connected by the internal wiring 20 to constitute an electronic circuit having an advanced (composite) function. The electrode of at least one chip part 10 is electrically connected to the external connection terminal 5 via the internal wiring 20, and the multi-chip module 1 is connected to external electrical or electronic circuits via the external connection terminals 5. The external connection terminals 5 are secured to the sealing resin 3 so as to be exposed from the outer surface of the sealing resin 3. That is, the external connection terminals 5 are arranged on the surface of the sealing resin 3 that seals the chip parts 10, thereby achieving a structure that allows for external connection without using a supporting substrate such as an interposer or a lead frame. Therefore, the miniaturization of the multi-chip module 1 is not limited by the machining accuracy of a supporting substrate, and thus the multi-chip module 1 can be miniaturized beyond the limit of machining accuracy of such supporting substrate.

Further, a plurality of chip parts 10 are electrically connected to each other in the sealing resin 3 via the internal wiring 20 in the sealing resin 3, and thus a multi-chip module 1 capable of providing advanced functions with a small number of the external connection terminals 5 can be achieved. Thereby, further miniaturization can be achieved.

According to this embodiment, the sealing resin 3 seals the plurality of chip parts 10 therein, and includes the first resin part 31 having the internal wiring 20 formed so as to be exposed from one surface thereof, and the second resin part 32 covering the one surface of the first resin part 31 so as to cover the inner wiring 20. The external connection terminals 5 are formed so as to be exposed from the second resin part 32. With this configuration, a multi-chip module 1 having a structure that seals the internal wiring 20 in the sealing resin 3 can be provided via a relatively simple manufacturing process.

In this embodiment, the integrated circuit chip 12 and the chip resistors 13, 14 are arranged to not overlap each other (so-called side-by-side arrangement). Further, the chip inductor 11 and the chip resistors 13, 14 are arranged side by side. The chip resistors 13, 14 are also arranged side by side. This structure facilitates creating a lower profile multi-chip module 1.

Whereas, the chip inductor 11 and the integrated circuit chip 12 are arranged to overlap each other in the plan view. The chip inductor 11 and the chip resistors 13, 14 are arranged to not overlap each other in the plan view with the heights of the bottom surface different from each other. With such a three-dimensional arrangement, the size of the multi-chip module 1 in the plan view decreases, to thus reduce the occupancy area of the multi-chip module 1 when mounted. In particular, in this embodiment, the height of the chip resistors 13, 14 is greater than the height of the integrated circuit chip 12, and the size of the integrated circuit chip 12 in the plan view is greater than that of the chip resistors 13, 14. Therefore, by arranging the chip inductor 11 and the integrated circuit chip 12 to overlap each other while arranging the chip resistors 13, 14 to not overlap the chip inductor 11, a lower profile multi-chip module with a smaller area is achieved.

In this embodiment, the integrated circuit chip 12 is completely overlapped by the chip inductor 11; however, only a part of the integrated circuit chip 12 may be overlapped by the chip inductor 11.

The chip inductor 11 is elevated by the thick film portions 21 of the internal wiring 20 functioning as conductive spacers, and the integrated circuit chip 12 is arranged in the space secured below the chip inductor 11 by the elevation. The plurality of chip parts 10 are thus arranged three-dimensionally. Since the spacer is constituted by using the internal wiring 20, both the chip inductor 11 and the integrated circuit chip 12 can be connected to the internal wiring 20, and can be connected to the external connection terminals 5 via the internal wiring 20.

In this embodiment, the chip parts 10 sealed together in the sealing resin 3 include one chip inductor 11, one integrated circuit chip 12, and two chip resistors 13, 14. For example, the integrated circuit chip 12 may be a power supply driver chip. In this case, a multi-chip module 1 having a power supply function can be provided.

Further, according to the manufacturing method for the multi-chip module 1 in this embodiment, the plurality of chip parts 10 can be arranged in the small arrangement region 42 by forming the fine internal wiring 20 on the wiring transfer substrate 40. Then, the wiring transfer substrate 40 is removed after the plurality of chip parts 10 are sealed on the wiring transfer substrate 40, and thus the multi-chip module 1 having a structure that supports the plurality of chip parts 10 with the sealing resin 3 without using a supporting substrate can be manufactured. External connection can be achieved by the external connection terminals 5 which are secured to the sealing resin 3 to be exposed from the sealing resin 3. The multi-chip module 1 is configured to not use a supporting substrate, and thus the multi-chip module 1 is not subject to the limitation in relation to the machining accuracy of such supporting substrate, and therefore, is advantageous for miniaturization.

Further, in the manufacturing method according to this embodiment, the plurality of arrangement regions 42 corresponding to the plurality of multi-chip modules 1 are provided on the wiring transfer substrate 40, and each step is executed at the same time for the plurality of arrangement regions 42. Then, the sealing structure 35 is made to collectively seal the components of the plurality of multi-chip modules 1 with the first resin part 31 which extends over the plurality of the arrangement regions 42, and then the sealing structure 35 is cut and divided into a plurality of regions to produce the plurality of multi-chip modules 1. The plurality of multi-chip modules 1 can be collectively manufactured in this way, and therefore the manufacturing method is advantageous for the mass production.

The formation of the internal wiring 20 on the wiring transfer substrate 40 is achieved by using the manufacturing steps of a semiconductor device. That is, the internal wiring 20 can be formed by using the manufacturing steps of a semiconductor device with the wiring transfer substrate 40 having a size and a shape that can be handled by semiconductor manufacturing equipment. Thereby, the fine internal wiring 20 can be formed. The plurality of multi-chip modules 1 are produced by arranging the plurality of chip parts 10 on the internal wiring 20, collectively sealing the plurality of chip parts 10 with a resin, and executing a step of cutting the resin. By adopting such a method, a plurality of regions for multi-chip modules can be provided on a wiring transfer substrate at a higher density than the case where a supporting substrate such as an interposer or a lead frame is used. As such, a large number of multi-chip modules 1 can be manufactured at one time, and therefore higher productivity can be achieved. For example, at most one hundred pieces of chips can be arranged on a lead frame with the size of 30 mm×100 mm. Whereas, when the wiring transfer substrate 40 with the size of 8 inch wafer is used, several thousands of chips can be arranged on the wiring transfer substrate 40 by using an automatic mounting machine. Thus, the number of multi-chip modules which can be manufactured at one time dramatically increases.

Figure 9:
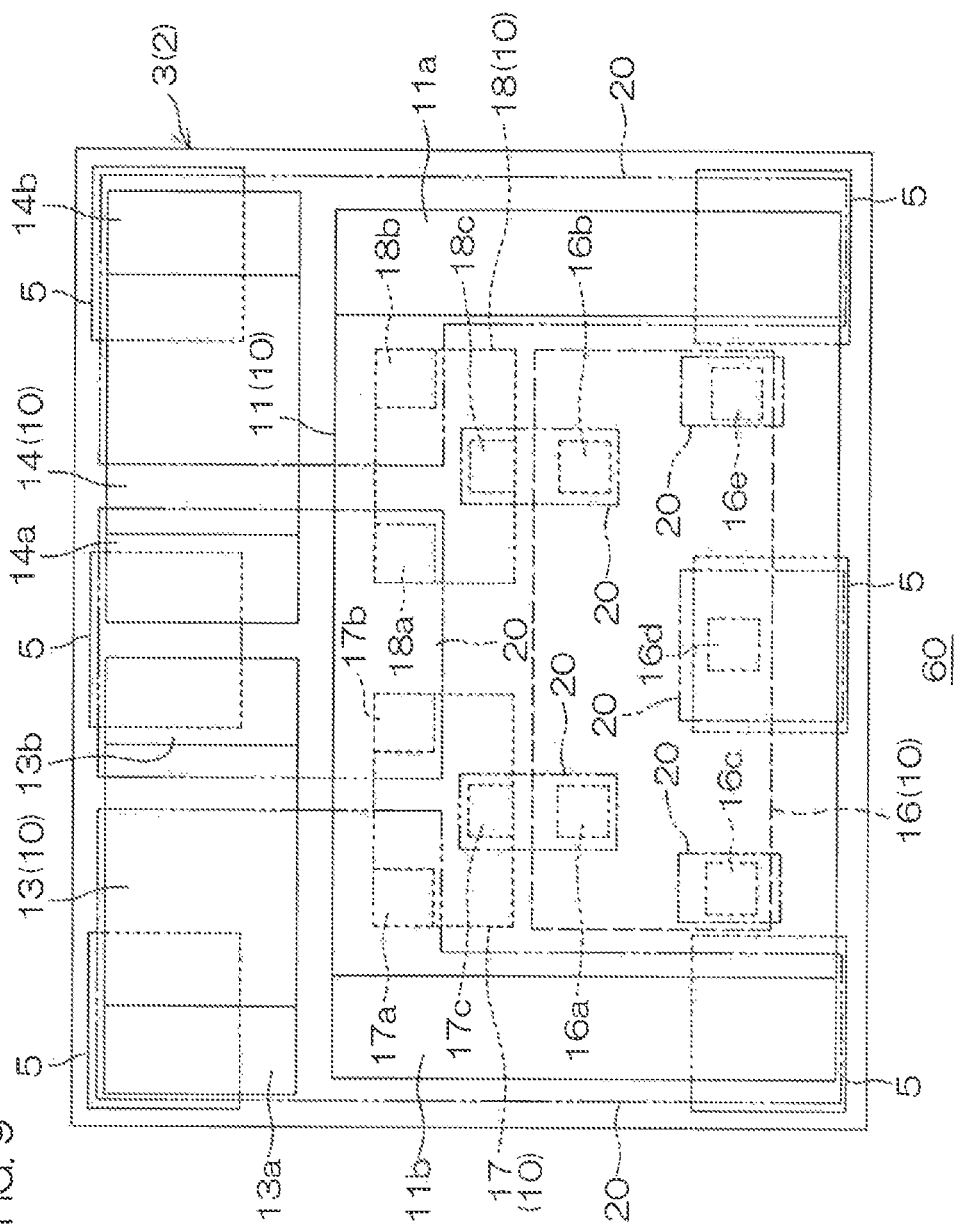
FIG. 9 is a perspective plan view illustrating the internal configuration of the multi-chip module according to a second embodiment of the present invention.

FIG. 9 is a plan view illustrating the configuration of the multi-chip module according to a second embodiment of the present invention, which illustrates the internal configuration perspectively similarly to FIG. 3. In FIG. 9, the same reference numerals are used for the parts corresponding to parts shown in FIG. 3.

In a multi-chip module 60 according to this embodiment, a plurality of chip parts 10 are arranged below a chip inductor 11 (between the chip inductor 11 and the bottom surface of a package body 2). Specifically, a controller chip 16, a first transistor chip 17, and a second transistor chip 18 are arranged below the chip inductor 11 so as to be completely overlapped by the chip inductor 11 in the plan view.

This multi-chip module 60 constitutes, for example, a power supply circuit. The first transistor chip 17 and the second transistor chip 18 may be, for example, a high-side power transistor and a low-side power transistor that constitute a half bridge circuit. The controller chip 16 may be an integrated circuit chip incorporating a control circuit for controlling the first and second transistor chips 17, 18.

The controller chip 16 includes electrodes 16a-16d, which are connected to the thin film portions 22 (also see FIG. 4) of the internal wiring 20 via solder. The first transistor chip 17 includes, for example, three electrodes 17a-17c, which are connected to the thin film portions 22 of the internal wiring 20 via solder. Similarly, the second transistor chip 18 includes, for example, three electrodes 18a-18c, which are connected to the thin film portions 22 of the internal wiring 20 via solder. In this way, the controller chip 16, the first and second transistor chips 17, 18, the chip inductor 11, and the chip resistors 13, 14 are connected in the sealing resin 3 via the internal wiring 20, thereby constituting an electronic circuit. The electrodes 16a-16d, 17a-17c, 18a-18c are composed of, for example, aluminum.

With such a configuration, a power supply circuit can be constituted by a multi-chip module 60 in which a controller and a power transistor are constituted by separate chips 16; 17, 18.

Figure 11:
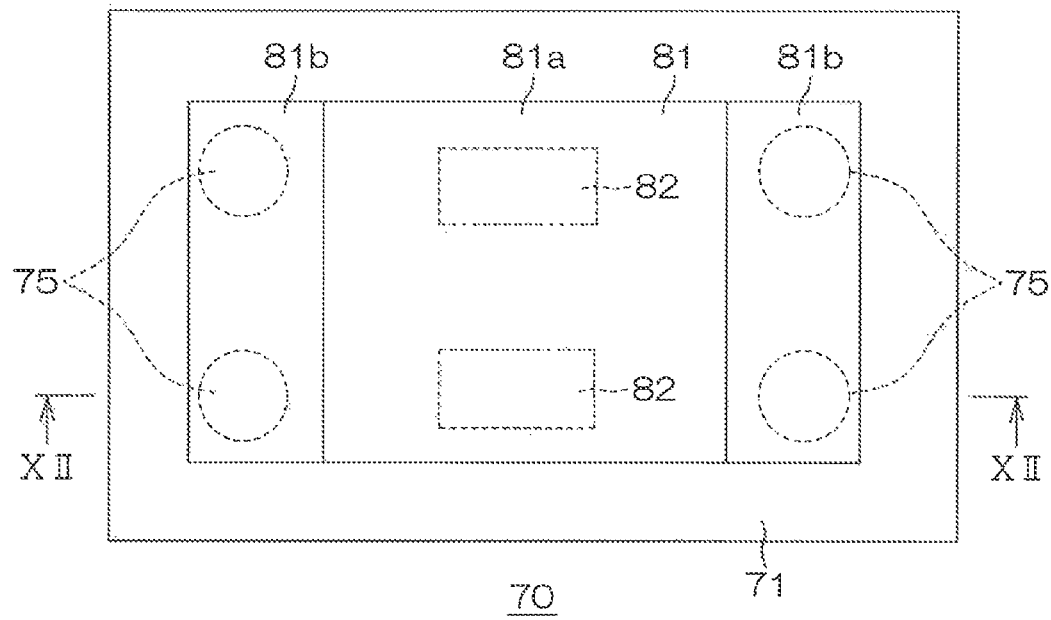
FIG. 11 is a plan view of the multi-chip module shown in FIG. 10.
Figure 12:
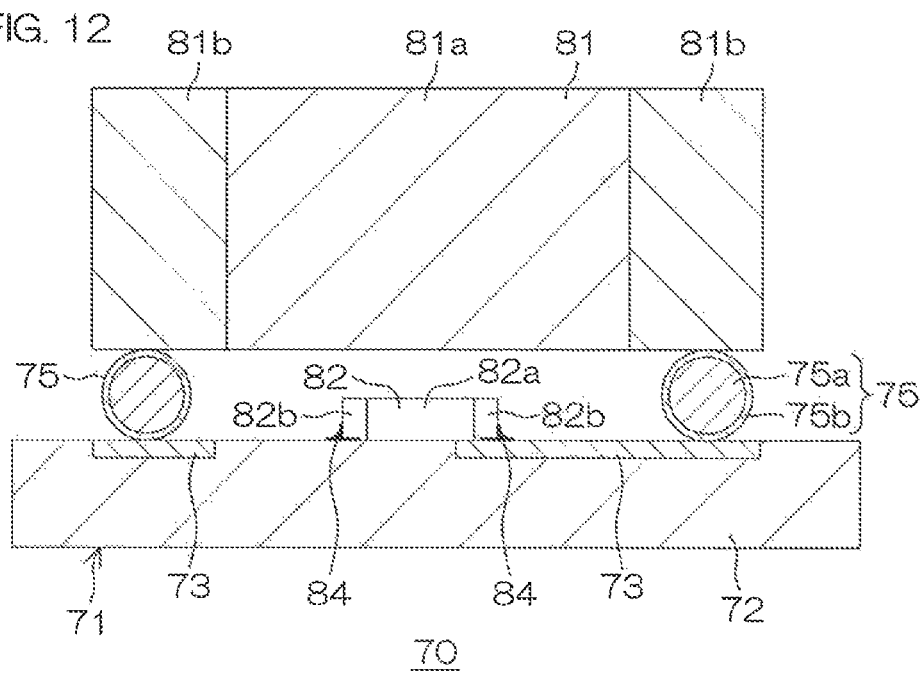
FIG. 12 is a cross-sectional view of the multi-chip module shown in FIG. 10 (a cross-sectional view taken along line XII-XII of FIG. 11).

FIG. 10, FIG. 11, and FIG. 12 illustrate an example of the structure of a multi-chip module having a plurality of chip parts mounted on a wiring substrate or circuit board. FIG. 10 is a perspective view, FIG. 11 is a plan view, and FIG. 12 is a cross-sectional view (a cross-sectional view taken along line XII-XII of FIG. 11) of the multi-chip module.

A multi-chip module 70 includes a wiring substrate 71, a first chip part 81 mounted on the wiring substrate 71, and two second chip parts 82 mounted on the wiring substrate 71. In FIG. 10, the first chip part 81, which is isolated before being mounted onto the wiring substrate 71, is shown as a solid line, and the first chip part 81, which is mounted on the wiring substrate 71, is shown as a chain double-dashed line.

The wiring substrate 71 includes an insulating substrate 72 and a wiring pattern 73 formed on the insulating substrate 72. The first chip part 81 includes a chip body 81a and electrodes 81b formed on the chip body 81a. The second chip parts 82 include a chip body 82a and electrodes 82b formed on the chip body 82a. The first chip part 81 is greater than the second chip part 82. For example, the first chip part 81 may be a chip inductor or a chip capacitor, and the second chip part 82 may be a chip resistor, an integrated circuit chip, or a transistor chip.

The electrodes 82b of the second chip part 82 are bonded to the wiring pattern 73 with solder 84. Whereas, the electrodes 81b of the first chip part 81 are bonded to the wiring pattern 73 via conductive spacers 75 each made up of an electrically conductive material. The first chip part 81 is elevated by the conductive spacers 75 to a position apart from the surface of the wiring substrate 71. The second chip parts 82 are arranged in a space, which is secured by the elevation between the first chip part 81 and the wiring substrate 71. That is, the bottom surfaces of the first chip part 81 and the second chip part 82 are positioned at mutually different heights so that these first and second chip parts are arranged three-dimensionally.

In this embodiment, the first chip part 81 and the second chip parts 82 have an overlapped portion in the plan view. More specifically, the second chip parts 82 are completely overlapped by the first chip part 81 in the plan view, and the second chip parts 82 are arranged below the first chip part 81. In this embodiment, each of the two second chip parts 82 is wholly overlapped by the first chip part 81 in the plan view.

In this embodiment, each of the conductive spacers 75 is a spherical body. More specifically, each of the conductive spacers 75 includes a spherical core 75a and a solder layer 75b covering the surface of the spherical core 75a. In the manufacturing process, the conductive spacers 75 are secured to the electrode 81b of the first chip part 81 by using, for example, flux. With this configuration, the first chip part 81 is mounted onto the wiring substrate 71, for example, by using an automatic mounting machine. That is, the first chip part 81 is mounted onto the wiring substrate 71 so that the conductive spacers 75 are positioned at the corresponding wiring patterns 73. With this configuration, by carrying out a reflow process, the solder layer 75b of the conductive spacers 75 are melted, and the melted solder bonds the core 75a to the electrode 81b of the first chip part 81 and the wiring patterns 73 on the wiring substrate 71, respectively. By cooling the wiring substrate after being taken out from a reflow furnace, the solder is solidified to strengthen the solder joints. The core 75a is made up of high-melting-point conductive metal (metal with a melting point higher than that of solder constituting the solder layer 75b) such as copper or copper alloy, which is not melted at a reflow temperature. As such, the first chip part 81 is elevated from the surface of the wiring substrate 71 at least by the distance corresponding to the diameter of the core 75a, and mounted onto the wiring substrate 71.

As shown by a chain double-dashed line in FIG. 10, the first and second chip parts 81, 82 may be sealed in a common sealing resin 77 on the wiring substrate 71.

As shown in FIG. 13 illustrating a variation, the conductive spacers 75 may each have a block shape, that is, a rectangular parallelopiped shape. More specifically, in the configuration shown in FIG. 13, each of the conductive spacers 75 has a rectangular parallelopiped shape (may have a cubic shape). Accordingly, each of the conductive spacers 75 includes a core 75a formed into a rectangular parallelopiped shape (may be formed into a cubic shape) and a solder layer 75b covering the surface of the core 75a.

Alternatively, the conductive spacer 75 may be a plate body composed of an electrically conductive material.

Although some of the embodiments according to the present invention have been described as above, the present invention can also be practiced by other embodiments. For example, in the first and second embodiments described above, the thick film portions 21 of the internal wiring 20 constitute a spacer for elevating the chip inductor 11. However, the conductive spacers 75 as shown in FIGS. 10-13 may be used in place of the thick film portions 21 of the internal wiring 20.

Further, the chip parts provided in a multi-chip module are not limited to the above-mentioned examples. For example, the multi-chip module may include a plurality of chip part in any combination of one or more types selected from a group consisting of a chip inductor, a chip capacitor, a memory chip, a chip resistor, an integrated circuit chip, and a micro-electromechanical system (MEMS) chip. Of course, different types of chip parts may be included, or chip parts of the same type may be included in the combination.

Further, in the embodiment described above, the sealing resin 3 includes the first resin part 31 and the second resin part 32. However, the sealing resin 3 may be composed of one type of resin, or three or more types of resin.

Furthermore, various design modifications may be made within the scope of claims.

Besides the features described in claims, the following features may be extracted from the present specification and the drawings:

1. A multi-chip module including a plurality of chip parts with each chip part having a different position of bottom surface.
2. A multi-chip module described in item 1, wherein the plurality of chip parts include at least two chip parts arranged to overlap each other in the plan view.
3. A multi-chip module described in item 1, further including a spacer composed of an electrically conductive material, bonded to the lower surface of the electrode of a first chip part among the plurality of chip parts, wherein at least a part of a second chip part among the plurality of chip parts is arranged in a space below the first chip part elevated by the spacer.
4. A multi-chip module described in item 3, wherein the whole of the second chip part is arranged in the space below the first chip part.
5. A multi-chip module described in item 3 or 4, wherein the spacer includes a core composed of an electrically conductive material, and a solder layer formed on the surface of the core.
6. A multi-chip module described in any one of items 1-5, wherein the first chip part is greater than the second chip part in the plan view.
7. A multi-chip module described in any one of items 1-6, wherein the plurality of chip parts includes a plurality of types of chip parts with each type of chip part having a different function.
8. A multi-chip module described in any one of items 1-7, wherein the plurality of chip parts includes at least one type selected from a group consisting of a chip inductor, a chip capacitor, a memory chip, a chip resistor, an integrated circuit chip, and a micro-electromechanical system (MEMS) chip.
9. A multi-chip module described in any one of items 1-8, further including a substrate supporting together the plurality of chip parts.
10. A multi-chip module described in item 9, wherein the substrate is a wiring substrate having a wiring pattern, and at least one of the plurality of chip parts is bonded to the wiring pattern.
11. A multi-chip module described in item 10, further including a spacer composed of an electrically conductive material, bonded to the lower surface of the electrode of at least one of the plurality of chip parts, and the spacer is bonded to the wiring pattern.

12. A chip part with a spacer, including a chip body, an electrode formed on the chip body, and a spacer composed of an electrically conductive material, bonded to the lower surface of the electrode (the surface of the electrode arranged closer to the bottom surface of the chip body).

The present application corresponds to Japanese Patent Application No. 2015-148706 filed in the Japan Patent Office on Jul. 28, 2015, and the entire disclosure of the application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multi-chip module comprising:
    a plurality of chip parts with each chip part having an electrode;
    a sealing resin that seals the plurality of chip parts; and
    an external connection terminal secured to the sealing resin so as to be exposed from an outer surface of the sealing resin and electrically connected to the electrode of at least one chip part of the plurality of chip parts, wherein
    the plurality of chip parts include a first chip part and a second chip part arranged to overlap each other in plan view, the first chip part being arranged over the second chip part, the first chip part having an extending portion outwardly extending beyond an edge of the second chip part in plan view, the electrode of the first chip part being provided at the extending portion thereof and extending over at least a portion of a lower surface of the first chip part and an entire portion of a side surface of the first chip part, the electrode having a bottom face substantially flush with the lower surface of the first chip part,
    the multi-chip module further comprises an internal wiring composed of an electrically conductive material that electrically connects at least two of the plurality of chip parts, and that is sealed in the sealing resin,
    the internal wiring includes a spacer arranged between the electrode of the first chip part and one surface of the sealing resin, the spacer having a side opposed to a side surface of the second chip part such that the side of the spacer overlaps with the side surface of the second chip part when viewed in a direction parallel with the lower surface of the first chip part,
    the multi-chip module further comprises a solder arranged between the bottom face of the electrode of the first chip part and the spacer,
    the solder is bonded to the bottom face of the electrode of the first chip part in direct contact therewith, and is bonded to the spacer in direct contact therewith,
    the external connection terminal is in direct contact with the spacer, thereby electrically connected to the electrode of the first chip part via the spacer and the solder, and
    the second chip part is arranged between the first chip part and the one surface of the sealing resin,
    wherein the sealing resin includes a first resin part that seals the plurality of chip parts therein and that exposes the internal wiring from one surface of the first resin part, and a second resin part that covers the one surface of the first resin part so as to cover the internal wiring, and the external connection terminal is formed so as to be exposed from the second resin part,
    wherein the first resin part is made of epoxy resin and the second resin part is made of polyimide resin.

2. The multi-chip module according to claim 1, wherein a supporting substrate is not interposed between the external connection terminal and the sealing resin, and the plurality of chip parts is supported by the sealing resin.

3. The multi-chip module according to claim 1, wherein the plurality of chip parts include at least two chip parts arranged not to overlap each other in plan view.

4. The multi-chip module according to claim 1, wherein the plurality of chip parts include a plurality of types of chip parts with each type of the chip parts having a different function.

5. The multi-chip module according to claim 1, wherein the plurality of chip parts include at least one type selected from a group consisting of a chip inductor, a chip capacitor, a memory chip, a chip resistor, an integrated circuit chip, and a micro-electromechanical system (MEMS) chip.

6. The multi-chip module according to claim 1, wherein the plurality of chip parts include a power supply driver chip, a chip inductor, and a chip resistor.

7. The multi-chip module according to claim 6, wherein the first chip part is the chip inductor, the second chip part is the power supply driver chip, the power supply driver chip is arranged below the chip inductor, and the power supply driver chip is completely overlapped by the chip inductor in plan view.

8. The multi-chip module according to claim 1, wherein the plurality of chip parts include a controller chip, a power transistor chip controlled by the controller chip, a chip inductor, and a chip resistor.

9. The multi-chip module according to claim 6, wherein the chip resistor is arranged so as not to have an overlapped portion with the chip inductor in plan view.

10. The multi-chip module according to claim 1, wherein the second resin part has a pad opening that exposes a portion of the internal wiring, and the external connection terminal is joined to the exposed portion of the internal wiring through the pad opening, and is adhered to and secured to a surface of the second resin part outside the pad opening.

11. The multi-chip module according to claim 10, wherein the pad opening is arranged directly under the spacer and exposes a portion of a lower surface of the spacer, and the external connection terminal is arrange directly under the spacer.

12. The multi-chip module according to claim 1, wherein the electrode of the first chip part is parallel with the lower surface of the first chip part.

13. The multi-chip module according to claim 1, wherein the external connection terminal is arranged directly under the spacer.

14. A multi-chip module comprising:
    a plurality of chip parts with each chip part having at least one electrode;
    a sealing resin that seals the plurality of chip parts, wherein:
        the plurality of chip parts include a first chip part and a second chip part arranged to overlap each other in plan view, the first chip part being arranged over the second chip part, the first chip part having an extending portion outwardly extending beyond an edge of the second chip part in plan view, the at least one electrode of the first chip part being provided at the extending portion thereof and extending over at least a portion of a lower surface of the first chip part and an entire portion of a side surface of the first chip part, the at least one electrode of the first chip part having a bottom face substantially flush with the lower surface of the first chip part;

a conductive wiring layer having first and second opposing surfaces and disposed within the sealing resin, the conductive wiring layer having a first region of a first thickness extending from the first surface of the conductive wiring layer and a second region of a second thickness less than the first thickness extending from the first surface of the conductive wiring layer;

the first region of the conductive wiring layer conductively interfaced with the bottom face of the at least one electrode of the first chip part and the second region of the conductive wiring layer conductively interfaced with the at least one electrode of the second chip part, the difference in thickness between the first and second regions spacing the first chip part over the second chip part with the first chip part disposed diametrically opposite the first surface of the conductive wiring layer from the second chip part;

the first region of the conductive wiring layer having a side opposed to a side surface of the second chip part such that the side of the first region of the conductive wiring layer overlaps with the side surface of the second chip part when viewed in a direction parallel with the lower surface of the first chip part;

the conductive interface between the first region of the conductive wiring layer and the bottom face of the at least one electrode of the first chip part being comprised of solder that is bonded to the bottom face of the at least one electrode of the first chip part in direct contact therewith, and that is bonded to the first region of the conductive wiring layer in direct contact therewith;

at least one external connection terminal secured to the sealing resin so as to be exposed from an outer surface of the sealing resin proximate the second surface of the conductive wiring layer; and the at least one external connection terminal conductively interfaced with the conductive wiring layer through the sealing resin on the second surface of the conductive wiring layer;

wherein the sealing resin includes a first resin part that seals the plurality of chip parts therein and that exposes the internal wiring from one surface of the first resin part, and a second resin part that covers the one surface of the first resin part so as to cover the internal wiring, and the external connection terminal is formed so as to be exposed from the second resin part;

wherein the first resin part is made of epoxy resin and the second resin part is made of polyimide resin.

15. The multi-chip module of claim 14, wherein the at least one external connection terminal is conductively interfaced with the second surface of the conductive wiring layer directly opposite an upper surface of the second region of the conductive wiring layer.

16. The multi-chip module of claim 14, wherein the conductive interface between the first and second regions of the conductive wiring layer and the respective ones of the at least one electrode is comprised of solder.

* * * * *